United States Patent [19]

Bauer et al.

[11] Patent Number: 4,849,322
[45] Date of Patent: Jul. 18, 1989

[54] POSITIVE-WORKING COLOR PROOFING FILM AND PROCESS

[75] Inventors: Richard D. Bauer; John G. Buzzell; Rusty E. Koenigkramer, all of Towanda, Pa.

[73] Assignee: E. I. Du Pont De Nemours and Company, Wilmington, Del.

[21] Appl. No.: 141,174

[22] Filed: Jan. 6, 1988

Related U.S. Application Data

[62] Division of Ser. No. 857,311, Apr. 30, 1986, Pat. No. 4,734,356.

[51] Int. Cl.$^4$ ............................................. G03C 1/68
[52] U.S. Cl. ..................................... 430/285; 430/910; 430/293; 430/912; 430/288; 522/79; 522/102
[58] Field of Search ............... 430/280, 285, 910, 293, 430/912, 288; 522/79, 102

[56] References Cited

U.S. PATENT DOCUMENTS

| | | | |
|---|---|---|---|
| 3,649,268 | 3/1972 | Chu et al. | 96/27 R |
| 3,661,576 | 5/1972 | Crary | 96/35.1 |
| 3,784,378 | 1/1974 | Gramas | 96/27 E |
| 4,174,216 | 11/1979 | Cohen et al. | 430/257 |
| 4,245,031 | 1/1981 | Chambers | 522/9 X |
| 4,264,708 | 4/1981 | Chambers et al. | 430/278 |
| 4,272,608 | 6/1981 | Proskow | 430/288 |
| 4,356,252 | 10/1982 | Lee | 430/270 |
| 4,454,218 | 6/1984 | Dueber et al. | 430/910 X |

FOREIGN PATENT DOCUMENTS 0075299  3/1983  European Pat. Off.
1443369  7/1976  United Kingdom.

OTHER PUBLICATIONS

Derwent Abstract of SU 996,984.
Derwent Aabstract of SU 739,462.

*Primary Examiner*—Paul R. Michl
*Assistant Examiner*—Cynthia Hamilton

[57] ABSTRACT

Photopolymer positive surprint color proofing film based on epoxy acrylate monomer exhibits low dot gain, low time dependence of toning and good tonal range. Binder can be methylmethacrylate/ethyl acrylate/acrylic acid copolymer, preferably cross-linked with zinc ions and plasticized with a second acrylate monomer and a mixture of triacetin and trimethylol propane.

3 Claims, No Drawings

POSITIVE-WORKING COLOR PROOFING FILM AND PROCESS

CROSS REFERENCE TO PRIOR APPLICATION

This is a division of application Ser. No. 857,311, filed Apr. 30, 1986 which issued on Mar. 29, 1988 as U.S. Pat. No. 4,734,356.

FIELD

This invention relates to films and processes for preparation of color proofs for the printing industry.

BACKGROUND

Offset printing is a process in which printing ink is transferred or "offset" from a printing plate to a rubber blanket and from there to a paper surface. When printing halftone dots by this process, a so-called "mechanical dot-gain" occurs because of the resiliency of the blanket. Ink is squeezed onto the surface, giving the dot a larger diameter than the corresponding dot on the printing plate. The amount of mechanical dot gain depends on printing conditions such as press pressure, ink rheology and paper quality. A so-called "optical dot gain" also occurs. The dot appears larger than it is, because light passing through the dot and paper surface is reflected within the paper at points outside the dot circumference ("shadow effect"). Amount of optical dot gain depends on paper texture and opacity.

Dot gain is lower at either end of the tonal range than at mid-range. It is ordinarily measured in print areas correspponding to 50% dot areas on the halftone negative from which the printing plate was made. Percentage values of halftone dot area coverage relate to a solid density of 100%. If the effective dot area (EDA) is 70%, then the dot gain is 20%. EDA is calculated by the Murray-Davies equation:

$$EDA = 100 \times \frac{1 - 10^{-D_T}}{1 - 10^{-D_S}}$$

where $D_T$ is density of the original 50% dot area and $D_S$ is density of a solid area, both relative to the paper, as determined on a densitometer.

Web presses typically produce a high dot gain of 25–30, sheet-fed presses a medium gain of 20–25, and proofing presses a low gain of 15–20.

Off-press positive surprint color proofs used in the graphic arts industry are made by the process of Chu et al. U.S. Pat. No. 3,649,268. In this process a tacky photopolymer film is laminated to paper and exposed to ultraviolet light through a color separation to halftone-positive transparency, causing polymerization and reduced tack in exposed areas. Toner particles of corresponding color are applied to the exposed film and adhere to the tacky unexposed areas only. Non-adhered toner is removed, leaving a positive toner image on the unexposed areas. Another piece of film is laminated to the toned layer, and the process is repeated using a different color separation transparency and corresponding color toner. Typically, four layers are built up in this manner, using yellow, magenta, cyan and black toners, although the colors and number of layers can vary. Photopolymer films disclosed in the Chu et al. patent comprise a support layer and a photopolymerizable layer having a binder component, an ethylenically unsaturated monomer component, and a photopolymerization initiator.

In making a color proof, the proper amount of exposure can be determined using a positive transparency having discrete areas of different percent dots, e.g., 0.5%, 1%, 2%. Typically, exposure is set to reproduce ("hold") 2% dots but lose 0.5% and 1% dots due to overexposure. Under these conditions mid-tone dots are typically reduced slightly, so there is no mechanical dot gain. However, color proofs exhibit high optical dot gain, due to light penetrating the dot and photopolymer surface and being reflected from points below, outside the dot circumference ("shadow effect"). The amount of gain varies with the particular photopolymer system used (intrinsic gain) and the thickness of the photopolymer layer (apparent gain). Optical gain in a color proof is desirable, because the purpose of the proof is to simulate as closely as possible the results which will be obtained on the printing press.

Photopolymer systems disclosed in the Chu et al. patent produce films with optical gain of about 20% of more. Thus, they are entirely adequate for making proofs for web presses and for some sheet-fed printing, but a film with lower dot gain would be desirable for "sharper" proofing and printing applications such as sheet-fed and press proof printing on high quality paper.

Systems of Chu et al. produce high optical dot gain in part because they must be coated in relatively thick layers (70 to 110 mg/sq. dm. dry coating weight, about 6.5 to 10.5 microns dry thickness). Otherwise, it is difficult to achieve consistent results in preparing multiple proofs of the same scene, because the optical density obtained will be dependent upon how much time elapses between exposure and toning, due to migration of mobile components in unexposed areas into the paper or lower photopolymer layer.

Another characteristic of systems of the Chu et al. patent is that the optical density obtained upon toning depends upon temperature at the time of toning. This is because tackiness of the unexposed photopolymer systems varies significantly over the normal room temperature range of 18° to 24° C. This characteristic also makes it difficult to achieve proof-to-proof consistency.

SUMMARY OF THE INVENTION

This invention resulted from efforts to produce a positive surprint film having lower dot gain with equivalent tonal range and time dependence of toning and with less temperature dependence of toning. It has been found that incorporation of a diacrylate or dimethacrylate ester of bisphenol A/epichlorohydrin epoxy resin into the photopolymerizable layer results in an intrinsic lowering of the dot gain and allows the coating of thinner layers which further lowers the dot gain without unduly increasing the time dependence of toning. It has also been found that use of methylmethacrylate/ethyl acrylate/acrylic acid binder crosslinked with zinc ions and plasticized with a mixture of triacetin and trimethylol propane reduces temperature dependence of toning.

In one aspect, this invention is an improved process of making a positive surprint multi-color proof by the steps of (a) laminating to paper the tacky photopolymerizable layer of a film composed of that layer and a transparent support layer;

(b) imagewise exposing the photopolymerizable layer to UV light through a color-separation halftone-positive transparency to cause polymerization and reduce tack in the exposed areas so that toner particles will not adhere to those areas;

(c) removing the support layer without disturbing the photopolymer layer;

(d) applying process-color toner to the photopolymer layer whereby the toner adheres to the unexposed areas only;

(e) removing non-adhered toner particles to leave a positive image;

(f) laminating to the toned photopolymer layer the photopolymerizable layer of another piece of the film and repeating steps (b)–(e) using a different color separation transparency and corresponding color toner; and (g) optionally repeating step (f) one or more times using a different process-color toner each time.

The improvement is characterized in that the photopolymer layer consists essentially of a diacrylate or dimethacrylate ester of bisphenol A/epichlorohydrin epoxy resin monomer, a compatible polymeric binder, and a photopolymerization initiator.

In another aspect, the invention is an improved photopolymer positive surprint color proofing film comprising a support layer and a contiguous photopolymerizable layer consisting essentially of methylmethacrylate/ethyl acrylate/acrylic acid copolymer, a plasticizer, a diacrylate or dimethacrylate ester of bisphenol A/epichlorohydrin epoxy resin, a di-, tri- or tetra-acrylate or -methacrylate which is a plasticizer for the copolymer, and a photopolymerization initiator. Preferably, the binder is crosslinked with zinc ions and the plasticizer is a mixture of triacetin and trimethylol propane.

In preferred form, the photopolymerizable layer of the film is about 2 to 6 microns thick (dry coating weight of about 20 to 60 mg/sq. dm.) and the 50% dot gain is about 15–20%.

The diacrylate and dimethacrylate esters of bisphenol A/epichlorohydrin epoxy resin (sometimes referred to hereinbelow as "the epoxy acrylates") can be represented by the formula:

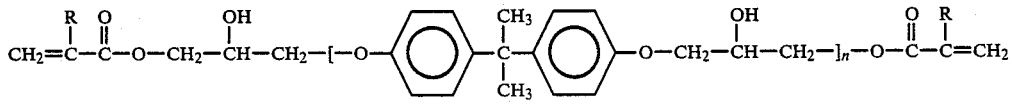

where R is H or $CH_3$ and n is a number from 1 to 3, inclusive.

PRIOR ART

Crary U.S. Pat. No. 3,661,576 discloses photopolymerizable compositions and films containing the epoxy acrylates, a binder and initiator and their use as photoresists in the manufacture of printed circuit boards and chemical milling and in the manufacture of etched printing plates. These applications involve removal of the unexposed areas prior to further processing, whereas in the color proofing process the unexposed areas remain in the final product to carry toner.

Cohen et al. U.S. Pat. No. 4,174,216, discloses use of the epoxy acrylates in peel-apart photopolymer films for positive and negative color proofs. These films are constructed and function in a different manner from the films of this invention. The films of Cohen et al. have a non-photosensitive tacky tonable elastomeric layer contiguous with the photopolymerizable layer and a coversheet over the photopolymerizable layer. The photopolymerizable layer is formulated so as to be photoadherent, i.e., so that either the exposed or unexposed areas will be more adherent to the coversheet than to the contiguous layer and will be removed with the coversheet when it is stripped from the film. If the exposed areas remain on the contiguous layer, a positive image can be produced by toning the contiguous layer and a negative image can be obtained by toning the unexposed photopolymer on the coversheet. If unexposed areas remain, a negative image can be produced by toning the contiguous layer, provided the unexposed areas are non-tonable under a condition in which the contiguous layer is tonable. In contrast, the films of this invention in both exposed and unexposed areas, must have greater adherence to the paper or lower toned photopolymer layer than to a coversheet. No peel-apart or "pick-off" can be tolerated. Unexposed area must remain intact because they are the areas which are toned, rather than a contiguous elastomeric layer as in Cohen et al.

Finally, Chambers et al. U.S. Pat. No. 4,264,708 discloses use of the epoxy acrylates in photopolymerizable films for making lithographic printing plates and printing reliefs and for "various pattern or image yielding purposes." Col. 9, lines 9–18. Chambers et al. states, at col. 8, lines 53–59, that the image can be developed by toning with fine pigment which selectively adheres to the tacky, unhardened layers, although the usual method of development is by removal of unexposed areas. However, Chambers et al, does not disclose use of the films in color proofing.

Neither Crary nor Cohen et al. discloses use of the epoxy acrylates with a lower viscosity monomer and methylmethacrylate/ethyl acrylate/acrylic acid terpolymer binder as in the novel films of this invention. Cohen et al. includes an Example 31 in which the binder was a methylmethacrylate/ethyl acrylate/acrylic acid terpolymer, but the monomer component did not include an epoxy acrylate. Chambers et al. mentions methylmethacrylate/ethylacrylate copolymers in a list of usable binders, col. 5, line 40 to col. 6, line 2, and also discloses use of a conventional acrylate with the epoxy acrylate, col. 3, line 43 to col. 4, line 31. However, no preference was stated for methylmethacrylate/ethyl acrylate and no example was given of a practical formulation containing one with an epoxy acrylate binder.

DETAILED DESCRIPTION

Films used in this invention must contain an epoxy acrylate, an organic polymeric binder, and a photopolymerization initiator.

The binder must be compatible with the epoxy acrylate; that is, it must provide film which is free of haze, streaks or mottle, both before and after exposure. It must also provide the proper adhesion balance between the color-proofing paper or toned photopolymer layer and the support sheet (usually polyethylene terephthalate) after exposure so that the support can be removed without pick-off. Binders which meet these criteria include polyvinylformal; polyvinyl butyral; polyvinyl acetate; polyurethane esters; polymethylmethacrylate; and copolymers of methylmethacrylate, ethylacrylate and/or acrylic acid. Preferred are methylmethacrylate/ethylacrylate/acrylic acid terpolymers.

Zinc acetonylacetate can be added to the composition to crosslink the methylmethacrylate/ethyl acrylate/acrylic acid copolymer. Crosslinking reduces the temperature dependence of toning especially when the crosslinked copolymer is plasticized with a mixture of triacetin and trimethylol propane in a weight ratio of about 2:1 to 1:2, preferably about 1:1. Zinc crosslinking also improves coatability. Thin coatings as used in the preferred films of this invention (20–60 mg/dm$^2$ or less) are difficult to coat by reverse roll, bar, 3-roll, extrusion die, hydropneumatic, dip pan, gravure or blade coating techniques, and cannot be coated or acceptable speed without the zinc crosslinker.

Although a mixture of triacetin and trimethylolpropane is the preferred plasticizer, other plasticizers can be used to lower the glass transition temperature of the photopolymerizable composition and make it sufficiently tacky that toner will adhere to unexposed areas. Conventional plasticizers, such as those listed in Chambers et al. U.S. Patent No. 4,264,708, col. 6, lines 31–49, incorporated herein by reference, can be used.

If enough plasticizer is used to provide adequate tackiness in unexposed areas, the exposed areas may remain too tacky and retain toner. To avoid this but still provide adequate tackiness in unexposed areas, a second monomer which has a plasticizing action on the binder can be used. Any conventional ethylenically unsaturated monomer can be used provided it has the requisite plasticizing action. Useful monomers include those listed in Chambers U.S. Pat. No. 4,264,708, col. 3, line 43 to col. 4, line 31 incorporated herein by reference. Preferred are the di-, tri- and tetra-acrylates and -methacrylates. Most preferred are trimethylolpropane triacrylate, trimethylolpropane trimethacrylate, ethoxylated trimethylolpropane triacrylate, pentaerythritoltriacrylate, and tetraethyleneglycoldimethacrylate.

A free radical generating addition polymerization initiator or initiator system activatable by actinic radiation is present in the photopolymerizable composition. A preferred photoinitiator is a hexaarylbiimidazole compound of the type described in Chambers et al. U.S. Pat. No. 3,479,185 and Ddessauer U.S. Pat. No. 4,252,887, both incorporated herein by reference. A preferred hexaarylbiimidazole compound is 2-o-chlorophenyl-4,5-bis-(m-methoxyphenyl)-imidazolyl dimer. Other useful photoinitiators are disclosed in U.S. Pat. No. 3,060,023, incorporated herein by reference.

Other components in addition to those described above can be present in the photopolymerizable compositions in varying amounts. Such components include: optical brighteners, ultraviolet radiation absorbing material, thermal stabilizers, hydrogen donors and release agents.

Optical brighteners useful in the process of the invention include those disclosed in Held U.S. Pat. No. 3,854,950, incorporated herein by reference. A preferred optical brightener is 7-(4'-chloro-6'-diethylamino-1',3',5'-triazine-4'-yl)amino 3-phenyl coumarin. Ultraviolet radiation absorbing materials useful in the invention are also disclosed in Held U.S. Pat. No. 3,854,950.

Useful thermal stabilizers include: hydroquinone, phenidone, hydroquinone monomethyl ether, p-methoxyphenol, alkyl and aryl-substituted hydroquinones and quinones, tert-butyl catechol, pyrogallol, copper resinate, naphthylamines, beta-naphthol, cuprous chloride, 2,6-di-tert-butyl p-cresol, phenothiazine, pyridine, nitrobenzene, dinitrobenzene, p-toluquinone and chloranil. The dinitroso dimers described in Pazos U.S. Pat. No. 4,168,982, incorporated herein by reference, are also useful.

Hydrogen donor compounds useful in the photopolymer compositions include: 2-mercaptobenzoxazole, 2-mercaptobenzothiazole, etc.; as well as various types of compounds, e.g., (a) ethers, (b) esters, (c) alcohols, (d) compounds containing allylic or benzylic hydrogen cumene, (e) acetals, (f) aldehydes, and (g) amides as disclosed in column 12, lines 18 to 58 of MacLachlan U.S. Pat. No. 3,390,996, incorporated herein by reference.

Compounds which have been found useful as release agents are described in Bauer U.S. Pat. No. 4,326,010, incorporated herein by reference. A preferred release agent is polycaprolactone.

While omission of any of the above-described additional components does not materially affect the improvement in dot gain achieved by the invention, other disadvantages may occur due to their absence. For example, halation problems can develop in the absence of the optical brighteners. Halation may also be a problem if the ultraviolet radiation absorbing material and thermal stabilizer are not present.

Amounts of ingredients in the photopolymerizable compositions will generally be within the following percentage ranges based on total weight of the photopolymerizable layer:
Epoxy acrylate, 5–50%, preferably 15–25%;
second monomer, 0–30%, preferably 5–25%;
binder, 25–75%, preferably 35–50%;
plasticizer, 0–25%, preferably 5–15%;
initiator 0.1–10%, preferably 1–5%;
zinc compound, 0–5%, preferably 1–4%;
other ingredients 0–5%, preferably 1–4%.

The transparent support is a conventional component and can be any of a number of films such as these described in Cohen U.S. Pat. No. 4,174,216. A preferred support is polyethylene terephthalate.

After lamination the exposure of the photopolymerizable element may be through line or halftone positive separations or artwork. The separation and the element generally are in contact during the exposure which may be made through either side in the case of an element that has transparent support and receptor. Preferably the element is exposed through the polyethylene terephthalate support side.

Since the photopolymerizable materials used in this invention exhibit their maximum sensitivity in the ultraviolet range, the light source should furnish an effective amount of this radiation. Such sources include carbon arcs, mercury-vapor arcs, fluorescent lamps with special ultraviolet-emitting phosphors, argon glow lamps, electronic flash units and photographic flood lamps. The amount of exposure required for satisfactory reproduction of a given element is a functio of exposure time, type of light source used, and distance between light source and element.

Each photopolymerizable element present in the multi-color proof, after imagewise exposure and removal of the support, is toned by applying colorant material. The various colorants are applied generally at room temperature but elevated temperatures can be used if required. Suitable toners are described in U.S. Pat. Nos.

3,649,268, 3,620,726, 3,909,282 and 4,215,193, all incorporated herein by reference. The toners may be applied by a dusting treatment similar to that disclosed in U.S. Pat. No. 3,060,024 or applied and distributed by means of a toner applicator as described in U.S. Pat. No. 4,087,279, incorporated herein by reference. The excess toner present in the exposed areas of the photopolymer element is removed physically by soft materials of various types, e.g., silicone-treated cloth, absorbent cotton, and acrylic pile.

EXAMPLES

The following examples illustrate the invention wherein the percentages are given by weight. In the following examples photosensitive compositions containing the ingredients set forth below are dissolved in methylene chloride at 15% solids. Samples are prepared to which are added the indicated compounds listed below. Compounds are added in the order listed, except that in Examples 15 and 16 the zinc compound is added last. Films are cast from a 0.0015 inch (0.038 mm) coating knife onto 0.0005 inch (0.013 mm) polyethylene terephthalate film giving a 0.00015 inch (0.0038 mm) coating after solvent removal. The solvent is removed by air drying.

This coating is laminated at about 110° C. to the smooth side of a 23 inch (58.4 cm) by 29 inch (73.7 cm) sheet of Kromekote ® cast-coated one-side paper, manufactured by Champion Paper and Fiber Company, using a Cromalin ® Laminator Model 2700 manufactured by E. I. du Pont de Nemours and Company, Wilmington, DE. This element is then given a blanket exposure with no artwork present in a Montakop vacuum contact frame manufactured by Siegfried Theimer Gmbh, Bad Homburg, West Germany fitted with a 5 KW photopolymer lamp. After the polyethylene terephthalate coversheet removal, a second clear photopolymer layer is laminated onto the first layer at 110° C. A 150 lines/inch 50% halftone screen tint manufactured by Beta Screen Corp., Carlstadt, NJ is positioned on top. The sample plus tint is placed in a Montakop vacuum contact frame and exposed with a 5 KW photopolymer lamp and Kokomo ® glass filter (No. 400), manufactured by the Kokomo Opalescent Glass Co., Kokomo, Ind. and given a sharp exposure where 2% highlight dots are just held. After exposure the tint and coversheet are removed. An Automatic Toning Machine Model 2900 manufactured by E. I. du Pont de Nemours and Company, Wilmington, DE is used to apply a magenta colorant material described in Example 11 of U.S. Pat. No. 4,215,193 to the photopolymer surface.

A third clear photopolymer layer is laminated onto the toned second layer at 110° C. The three-layer element is then given a blanket exposure with no artwork present and the coversheet removed. Two additional layers are added in gthis same manner to simulate a traditional five layer proof.

The effective dot areas (EDA) of the toned tint in the finished proof is measured using the green filter on a Macbeth RD-918 densitometer manufactured by Kollmorgen Corp., Newburgh, NY. As explained in the RD-918 manual (issue date 12-1980), the Murray-Davies equation (J. Franklin Inst., Vol. 221, pages 721–744, 1936) is used to calculate the effective dot area. The dot gain is the effective dot area minus the screen tint (50).

EXAMPLES 1 to 6

| Ingredient | Amount (g) |
| --- | --- |
| Optical brightener (1) | 3.20 |
| 2-Mercaptobenzoxazole | 1.63 |
| 2,2'-Bis-(o-chlorophenyl)-4,4',5,5' tetraphenylbiimidazole | 1.46 |
| Ethyl acrylate (56%)/methylmethacrylate (37%)/acrylic acid (7%) copolymer MW = 260,000; Acid No. = 80; | 38.69 |

(1) 7-(4'-Chloro-6'-diethylamino-1',3',5-triazine-4'-yl) amino 3-phenyl coumarin

| 51.1 grams of Additive | Magenta 50% Tint Dot Gain |
| --- | --- |
| (1) Trimethylolpropanetrimethacrylate | 24 |
| (2) Trimethylolpropanetriacrylate | 24 |
| (3) Diacrylate ester of bisphenol A epoxy resin derived from bisphenol A and epichlorohydrin viscosity (25° C.) = 1,000,000 cps | 22 |
| (4) Polyoxyethylatedtrimethylolpropanetriacrylate, MW~1162 | 23 |
| (5) Pentaerythritol triacrylate | 25 |
| (6) Tetramethylene glycol dimethacrylate | 24 |

Using the same photopolymer films and equipment shown above the following experiment is performed. After laminating the first layer of photopolymer to a 29×40 inch (73.7×101.6 cm) sheet of Kromekote ®, a checkerboard (2 inch {5.1 cm} squares) of masking material is placed on top and together placed in a Montakop vacuum frame. After the exposure the mask is removed and the Kromekote is cut in half (20 inch {50.8 cm} by 29 inch {73.7 cm}). One 20 inch sheet is set aside and held. The other sheet is processed immediately by removing the coversheet and being placed in an Automatic Toning Machine Model 2900 where a cyan colorant material is applied as described in Example 1 of U.S. Pat. No. 4,215,193 to the photopolymer surface. After 30 minutes, the held card is processed in the same manner.

A second clear photopolymer layer is laminated onto the toned first layer at 110° C. The two-layer element is then given a blanket exposure with no artwork present and the coversheet removed. Three additional layers are added in this same manner to simulate a traditional five layer proof.

The density of the toned solid areas in the finished proofs is measured using the red filter on a Macbeth RD-918 densitometer. The observed density loss equals the density (zero time) minus density (30 minutes).

EXAMPLES 7 to 12

| 51.1 grams of Additive | Density Loss In 30 Minutes |
| --- | --- |
| (7) Trimethylolpropanetrimethacrylate | 0.10 |
| (8) Trimethylolpropanetriacrylate | 0.11 |
| (9) Diacrylate ester of bisphenol A epoxy resin derived from bisphenol A and epichlorohydrin viscosity (25° C.) = 1,000,000 cps | 0.03 |
| (10) Polyoxyethylatedtrimethylolpropane triacrylate, MW~1162 | 0.08 |
| (11) Pentaerythritol triacrylate | 0.13 |
| (12) Tetramethylene glycol dimethacrylate | 0.09 |

If the solution used in Examples 1 and 7 is cast from a 0.0045 inch (0.114 mm) coating knife onto a 0.0005 inch (0.013 mm) polyethylene terephthalate film and allowed to air dry, a 0.000.45 inch (0.0114 mm) coating is obtained. As seen in the table below, this film (Example 13) when compared with the film used in Examples 3 and 9 shows equal toned density stability but significantly higher dot gain. Examples 13 and 14 are tested in the same manner as Examples 1–12.

EXAMPLES 13 and 14

| 51.1 grams of Additive | Coating Thickness (mils) | Density Loss in 30 Minutes | Magenta 50% Tint |
|---|---|---|---|
| (13) Trimethylol-propane-trimethacrylate | 0.45 | .03 | 26 |
| (14) Diacrylate ester of bisphenol A epoxy resin derived from bisphenol A and epichlorohydrin viscosity (25° C.) = 1,000,000 cps | 0.15 | .02 | 21 |

The solutions and films in Examples 15 and 16 are prepared as in Example 1. After laminating the first layer to Kromekote ®, giving a blanket exposure, and removing the coversheet, the second layer is laminated. A checkerboard of masking material is placed on top and together they are exposed in a Montakop vacuum frame. Next, the mask and coversheet are removedd. The two-layer element is then placed in an Automatic Toning Machine Model 2900 where a magneta colorant material is applied as described in Example 11 of U.S. Pat. No. 4,215,193 to the photopolymer surface.

A third clear photopolymer layer is laminated onto the toned second layer at 110° C. The three-layer element is then given a blanket exposure with no artwork present and the coversheet removed. Two additional layers are added in this same manner to simulate a traditional five layer proof.

The procedure outlined above is performed first at room temperature (72° F.) then at the elevated temperature of 92° F. The ensity of the toned solid areas in the finished proofs is measured using the green filter on a Macbeth RD-918 densitometer. The temperature dependence of toning equals:

$$\frac{\text{density (92° F.) minus density (72° F.)}}{20° F.}$$

EXAMPLES 15 and 16

| Ingredient | Amount (g) |
|---|---|
| Diacrylate ester of bisphenol A epoxy resin derived from bisphenol A and epichlorohydrin viscosity (25° C.) = 1,000,000 cps | 40.87 |
| Optical brightener[1] | 3.38 |
| 2-Mercaptobenzoxazole | 0.70 |
| 2,2'-Bis-(o-chlorophenyl)-4,4',5,5' tetraphenylbiimidazole | 1.46 |
| Hydroquinone | 0.03 |
| Ethyl acrylate (56%)/methyl-methacrylate (937%) acrylic acid (7%) copolymer; MW = 260,000; Acid No. = 80; Tg = 35° C. | 37.85 |
| Zinc acetylacetonate (2.61 grams) | 39.71 |

EXAMPLES 15 and 16-continued

| dissolved in 37.0 grams of methanol | |
|---|---|
| Additives (grams) | OD/°F. |
| (15) Diacrylate ester of bisphenol A epoxy resin derived from bisphenol A and epichlorohydrin, viscosity (25° C.) = 1,000,000 cps; (13.1) | 0.0115 |
| (16) Trimethylolpropane (6.55) and glyceryl triacetate (triacetin) (6.55) | 0.0030 |

(1) 7-(4'-Chloro-6'- diethylamino-1',3',5'-triazine-4'-yl) amino 3-phenyl coumarin The best mode is illustrated below. The solution is prepared and film cast as described for Examples 1–12 and 15–16 as above and the resulting film laminated to Kromekote ®. A 150 lines/inch 50% halftone screen tint is placed on top. The sample plus tint is placed in a vacuum contact frame and exposed with a 5 KW photopolymer lamp and Kokomo ® glass filter (No. 400). A sharp exposure is given such that 2% highlight dots are just held. After exposure, the tint and polyethylene terephthalate film are removed. An Automatic Toning Machine Model 2900 manufactured by E. I. du Pont de Nemours and Company, Wilmington, DE is used to apply a yellow colorant material described in Example 9 of U.S. Pat. No. 4,215,193 to the photopolymer surface.

A second clear photopolymer layer is laminated onto the yellow toned first layer at 110° C. As outlined above the two-layer element is then exposed through a 150 lines/inch 50% tint and the coversheet removed. To the photopolymer surface a magenta colorant material described in Example 11 of U.S. Pat. No. 4,215,193 is applied. This procedure is repeated two more times toning the third layer with a cyan colorant material described in Example 1 of U.S. Pat. No. 4,215,193 and the fourth layer with a black colorant material described in Example 10 of U.S. Pat. No. 4,215,193.

After application of the black toner, a fifth photopolymer element is laminated at 110° C. over the four-color halftone positive. The five-layer element is given an overall blanket exposre under the above described light source. Next, the polyethylene terephthalate coversheet is removed.

The effective dot areas (EDA) of the toned tint in the finished proof are measured using a Macbeth RD-918 densitometer. The yellow, magenta, cyan, black tints are measured using a green, blue, red, and visual filters respectively. As explained above, the Murray-Davies equation is used to calculate the effective dot area. The following results are obtained for the indicated colored toners wherein the dot gain is the effective dot area minus the screen tint (50).

EXAMPLES 17 TO 20

| Ingredient | Amount (g) |
|---|---|
| Diacrylate ester of bisphenol A epoxy resin derived from bisphenol A and epichlorohydrin viscosity (25° C.) = 1,000,000 cps | 18.48 |
| Trimethylolpropanetrimethacrylate | 13.66 |
| Optical brightener(1) | 2.06 |
| 2-Mercaptobenzoxazole | 0.83 |
| 2,2'-Bis-(o-chlorophenyl)-4,4',5,5' tetraphenylbiimidazole | 1.71 |
| Trimethylolpropane | 5.08 |
| Glycerol triacetate | 6.75 |
| Methoxyhydroquinone | 0.022 |

EXAMPLES 17 TO 20-continued

| | |
|---|---|
| Thermal inhibitor[2] | 0.05 |
| Diethylhydroxylamine | 0.09 |
| Ethyl acrylate (57%)/methylmethacrylate-(39%) acrylic acid(4%) copolymer MW = 192,000; Acid No. = 57; Tg = 33° C. | 18.06 |
| Ethyl acrylate, Acid No. = 63; Tg = −14° C. viscosity (25° C.) = 2,000,000 cps; MW = 7,000 | 5.40 |
| Ethyl acrylate(17%)/methylmethacrylate-(71%)/acrylic acid(12%) copolymer MW = 200,000; Acid No. = 100; Tg = 80° C. | 25.15 |
| Polycaprolactone MW = 15,000; M.P. = CO °C; Tg = CO °C. | 0.20 |
| Zinc acetylacetonate(2.45 grams) dissolved in 37.0 grams of methanol | 39.45 |

| Toner | 50% Dot Gain |
|---|---|
| (17) Yellow | 18 |
| (18) Magenta | 18 |
| (19) Cyan | 18 |
| (20) Black | 19 |

(1) 7-(4'Chloro-6'-diethylamino 1',3',5'-triazine 4'-yl)amino 3-phenyl coumarin
(2) 1,4,4-Trimethyl-2,3-diazobicyclo-(3.2.2)-non-2-ene-2,3-dioxide

We claim:

1. A photopolymer positive surprint color proofing film comprising a support layer and a contiguous photopolymerizable layer consisting essentially of methylmethacrylate/ethyl acrylate/acrylic acid copolymer, a first plasticizer for the copolymer, a diacrylate or dimethacrylate ester of bisphenol A/epichlorohydrin epoxy resin as a first monomer, a di-, tri- or tetra-acrylate or -methacrylate which is a second monomer and also a second plasticizer for the copolymer, wherein said second monomer is different from the diacrylate or dimethacrylate ester of bisphenol A/epichlorohydrin epoxy resin, and a photopolymerization initiator.

2. A film of claim 1, wherein copolymer is crosslinked with zinc ions and the first plasticizer is a mixture of triacetin and trimethylolpropane.

3. Film of claim 2 wherein the second monomer is trimethylol propane trimethacrylate.

* * * * *